United States Patent [19]

Amishiro et al.

[11] Patent Number: 5,243,560
[45] Date of Patent: Sep. 7, 1993

[54] SEMICONDUCTOR MEMORY DEVICE FOR STORING A PLURALITY OF DATA ON A WORD BASIS AND OPERATING METHOD THEREOF

[75] Inventors: Hiroyuki Amishiro; Kumiko Fujimori, both of Hyogo, Japan

[73] Assignee: Mitsubishi Denki Kabushiki Kaisha, Tokyo, Japan

[21] Appl. No.: 753,571

[22] Filed: Sep. 3, 1991

[30] Foreign Application Priority Data

Sep. 11, 1990 [JP] Japan ................................ 2-241754

[51] Int. Cl.$^5$ .............................................. G11C 11/34
[52] U.S. Cl. ............................. 365/189.01; 365/230.01
[58] Field of Search .................. 365/189.01, 189.05, 365/230.01

[56] References Cited

U.S. PATENT DOCUMENTS 3,805,254  4/1974  Schuur .......................... 365/189.01

*Primary Examiner*—Joseph A. Popek
*Attorney, Agent, or Firm*—Lowe, Price, LeBlanc & Becker

[57] ABSTRACT

The semiconductor memory device includes a memory cell array for storing a plurality of data on a word basis, a data input-output device and a read control device. The data input-output device includes a plurality of data holding circuits corresponding to one word. The data of one word is divided into a plurality of subwords. The read control device brings to an active state any one of a plurality of control signals corresponding to the plurality of subwords in response to an externally applied subword selection signal. The data holding circuit corresponding to one subword is thereby activated. As a result, any subword among the data of one word held in the data holding circuit is rewritten with a corresponding subword among the data of one word read from the memory cell array.

14 Claims, 7 Drawing Sheets

| BIT | 0 | 1 | 2 | 3 | 4 | 5 | 6 | 7 | ---- |
|---|---|---|---|---|---|---|---|---|---|
| ADDRESS A | a0 | a1 | a2 | a3 | a4 | a5 | a6 | a7 | |
| ADDRESS B | b0 | b1 | b2 | b3 | b4 | b5 | b6 | b7 | |

| | ADDRESS | SUBWORD | $DO_0$ | $DO_1$ | $DO_2$ | $DO_3$ | $DO_4$ | $DO_5$ | $DO_6$ | $DO_7$ |
|---|---|---|---|---|---|---|---|---|---|---|
| 1 CYCLE | A | $SW_0$ | a0 | a1 | a2 | a3 | x4 | x5 | x6 | x7 |
| 2 CYCLE | B | $SW_1$ | a0 | a1 | a2 | a3 | b4 | b5 | b6 | b7 |

SEMICONDUCTOR MEMORY DEVICE FOR STORING A PLURALITY OF DATA ON A WORD BASIS AND OPERATING METHOD THEREOF

BACKGROUND OF THE INVENTION

1. Field of the Invention

The invention relates generally to semiconductor memory devices and, more particularly, relates to a semiconductor memory device for storing a plurality of data on a word basis and an operating method thereof.

2. Description of the Background Art

FIG. 8 is a diagram showing one example of a conventional semiconductor memory device for storing a plurality of data on a word basis. This semiconductor memory device is disclosed in Japanese Patent Laying-Open No. 3-25793 and "1989 SPRING NATIONAL CONVENTION RECORD, THE INSTITUTE OF ELECTRONICS, INFORMATION AND COMMUNICATION ENGINEERS", PP. 5-304.

In this semiconductor memory device, data of one word is divided into a plurality of subwords, and control of input and output for each subword is possible. In this example, one word includes input data DI0–DI15 of 16 bits or output data DO0–DO15, and one word is divided into four subwords SW0–SW3. The subword SW0 includes input data DI0–DI3 of 4 bits or output data DO0–DO3 of 4 bits. The subwords SW1, SW2, SW3 also include input data of 4 bits or output data of 4 bits. That is, suppose k=0, 1, 2, 3, a subword SWk includes input data DI (4k)–DI (4k+3) or output data DO (4k)–DO (4k+3).

In FIG. 8, a bit line load device 2, a column selection circuit 3 and an addressing device 4 are connected to a memory cell array 1. A detailed configuration of the memory cell array is shown in FIG. 9. Referring to FIG. 9, a plurality of word lines WL and a plurality of bit line pairs BL, $\overline{BL}$ are arranged to cross each other with memory cells MC provided at their cross-over points. Each memory cell MC includes two inverters G21, G22 constituting a latch circuit and N channel MOS transistors Q71, Q72.

The addressing device 4 in FIG. 8 includes a holding circuit 5 for holding N address signals A0–AN−1 which are externally applied and a decoder 6 for decoding and applying an address signal supplied from the holding circuit 5 to the memory cell array 1.

Referring back to FIG. 9, one of the plurality of word lines WL is selected, and 16 bit line pairs BL, $\overline{BL}$ corresponding to one word are selected in the plurality of bit line pairs BL, $\overline{BL}$ by the column selection circuit (FIG. 8) in response to the address signal decoded by the decoder 6 (FIG. 8).

A data input-output device 70, a write control device 8, a read control device 90 and an output control device 91 are provided in FIG. 8.

The data input-output device 70 includes 16 write circuits WC0–WC15, 16 data holding circuits DH0–DH15 and 16 output circuits OC0–OC15. The write circuits WC0–WC3, the data holding circuits DH0–DH3 and the output circuits OC0–OC3 are provided corresponding to the subword SW0. Similarly, the write circuit WC (4k)–WC (4k+3), the data holding circuits DH (4k)–DH (4k+3) and the output circuits OC (4k)–OC (4k+3) are provided corresponding to a subword SWk, where k represents 0, 1, 2, 3.

The write control device 8 includes four 3-input NOR circuits G1–G4 corresponding to four subwords SW0–SW3. An externally applied chip enable signal $\overline{CE}$ is supplied to one input terminal of each of the NOR circuits G1–G4, and an externally applied write enable signal $\overline{WE}$ is supplied to the other one input terminal. Externally applied sub write enable signals $\overline{SWE0}$–$\overline{SWE3}$ are applied to the remaining input terminals of the NOR circuits G1–G4, respectively. The sub write enable signals $\overline{SWE0}$–$\overline{SWE3}$ respectively correspond to the subwords SW0–SW3. The output of the NOR circuit G1 is supplied to the control terminals of four corresponding write circuits WC0–WC3. Similarly, the output of each of the NOR gates G2–G4 is supplied to the control terminals of four corresponding write circuits.

The externally applied input data DI0–DI15 is applied to the write circuits WC0–WC15 respectively. The data of one word (16 bits) read from the memory cell array 1 is held respectively in the data holding circuits DH0–DH15, and externally supplied through the output circuits OC0–OC15 as output data DO0–DO15.

The read control device 90 includes a 2-input AND circuit. An inverted signal of the chip enable signal $\overline{CE}$ is supplied to one input terminal of the read control device 90, and the write enable signal $\overline{WE}$ is supplied to the other input terminal.

The output control device 91 includes four buffer circuits G11–G14 corresponding to four subwords SW0–SW3. Sub output enable signals $\overline{SOE0}$–$\overline{SOE3}$ are supplied to the input terminals of the buffer circuits G11–G14. The output of the buffer circuit G11 is supplied to the control terminals of four corresponding output circuits OC0–OC3 as an output control signal. Similarly, the output of each of the buffer circuits G11–G14 is respectively supplied to the control terminal of each of four corresponding output circuits as an output control signal.

The operation of writing data will now be described.

Suppose that the subword SW0 controlled by the sub write enable signal $\overline{SWE0}$ is selected, and other subwords SW1–SW3 are not selected.

The chip enable signal $\overline{CE}$ is brought to an L level. This semiconductor memory device becomes capable of writing or reading data. 16 memory cells MC in which data is to be written in the memory cell array 1 are selected by address signals A0–AN−1.

When the write enable signal $\overline{WE}$ attains an L level, the output of the read control device 90 attains an L level. As a result, the data holding circuits DH0–DH15 provides high impedance outputs.

Furthermore, the sub write enable signal $\overline{SWE0}$ attains an L level, and the remaining sub write enable signals $\overline{SWE1}$–$\overline{SWE3}$ remain at an H level. The output of the NOR circuit G1 attains an H level, and the outputs of the NOR circuits G2–G4 attain an L level. The write circuits WC0–WC3 are brought to an active state, and the remaining write circuits are put in an inactive state, so that it becomes possible to input the input data DI0–DI3 belonging to the subword SW0. The subword SW0 is therefore written in four corresponding memory cells MC in the 16 selected memory cells MC. At this time, writing of data is not effected in a memory cell MC corresponding to the subwords SW1–SW3 in the 16 selected memory cells MC.

The operation of reading data will now be described.

Suppose that the subword SW0 controlled by the sub output enable signal $\overline{SOE0}$ is selected, and other subwords SW1-SW3 are not selected.

When the chip enable signal $\overline{CE}$ attains an L level, this semiconductor memory device becomes capable of writing or reading data. 16 memory cells MC in which data is to be read in the memory cell array 1 are selected by address signals A0-AN-1.

When the write enable signal $\overline{WE}$ attains an H level, the outputs of the NOR circuits G1-G4 attain an L level regardless of the state of the sub write enable signals $\overline{SWE0}$-$\overline{SWE3}$. The outputs of the write circuits WC0-WC15 are brought to a high impedance state.

The output of the read control device 90 attains an H level, and the data holding circuits DH0-DH15 are brought to an active state. As a result, the data of one word read from the memory cell array 1 is held in the data holding circuits DH0-DH15.

The sub output enable signal $\overline{SOE0}$ attains an L level, and the sub output enable signals $\overline{SOE1}$-$\overline{SOE3}$ remain at an H level. The output control signal supplied from the buffer circuit G11 attains an H level, and the output control signals supplied from other buffer circuits G12-G14 attain an L level. As a result, four output circuits OC0-OC3 corresponding to the subword SW0 are brought to an active state, and the remaining output circuits are put in an inactive state. The data held in the data holding circuits DH0-DH3 is externally supplied through the output circuits OC0-OC3 as output data DO0-DO3. Data held in the data holding circuits corresponding to the subwords SW1-SW3 is not outputted.

As stated above, any subword in externally applied data of one word can be written in the memory cell array 1, and any subword in data of one word stored in the memory cell array 1 can be externally read.

In the semiconductor memory device above, however, when data of one word is read from the memory cell array 1, data of one word which has been held in the data holding circuits DH0-DH15 is rewritten with the read data of one word. That is, when new data of one word is read from the memory cell array 1 after any subword in the plurality of subwords held in the data holding circuits DH0-DH15 is externally read, the subword which was not externally read in the plurality of subwords held in the data holding circuits DH0-DH15 is also rewritten with the new data.

Therefore, it is impossible to generate in the device new data including a subword contained in some one word and a subword contained in other word.

With diversification of a system, it is thought that the scope of application of a semiconductor memory device can be expanded if a subword contained in some one word and a subword contained in other word can be combined together in a device.

SUMMARY OF THE INVENTION

One object of the invention is to provide a semiconductor memory device, the scope of application of which is expanded.

Another object of the invention is to provide a semiconductor memory device capable of internally combining a subword in any word with a subword in any other word.

Still another object of the invention is to provide a semiconductor memory device capable of dividing each word into a plurality of subwords by a plurality of ways, and internally combining a subword in any word divided by any way with a subword in any other word.

Yet another object of the invention is to provide an operating method in which a subword contained in one word can be internally combined with a subword contained in another word in a semiconductor memory device.

A semiconductor memory device in accordance with the invention includes storing circuitry for storing a plurality of data in a word basis, first selecting circuitry for selecting and reading data of one word in the plurality of data stored in the storing circuitry, holding circuitry for holding data of one word, and dividing circuitry for dividing data of one word held in the holding circuitry into a plurality of subwords. The semiconductor memory device further includes second selecting circuitry. The second selecting circuitry selects any of the plurality of subwords divided by the dividing circuitry and rewrites the selected subword with a corresponding subword in the data of one word read from the storing circuitry.

In accordance with the semiconductor memory device, the selected subword in the data of one word held in the holding circuitry can be rewritten with a corresponding subword in the data of one word read from the storing circuitry. Therefore, a subword which is not selected in the data of one word held in the holding circuitry is not rewritten with newly read data. Accordingly, a subword in any word can be internally combined with a subword in any other word.

Thus, it becomes possible to internally generate one new word by combining a subword in any word with a subword in any other word. Therefore, a semiconductor memory device may be obtained, the scope of application of which is expanded.

A semiconductor memory device in accordance with another aspect of the invention includes storing circuitry for storing a plurality of data on a word basis, first selecting circuitry for selecting and reading data of one word in the plurality of data stored in the storing circuitry, holding circuitry for holding data of one word, and dividing circuitry for dividing the data of one word held in the holding circuitry into a plurality of subwords by any way of a plurality of ways. The semiconductor memory device further includes second selecting circuitry. The second selecting circuitry selects any of the plurality of subwords divided by the dividing circuitry and rewrites the selected subword with a corresponding subword in the data of one word read from the storing circuitry.

Particularly, in accordance with the semiconductor memory device, each word can be divided into a plurality of subwords by a plurality of ways, and it becomes possible to internally combine a subword in any word divided by any way with a subword in any other word.

Therefore, a semiconductor memory device whose scope of application is further expanded may be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
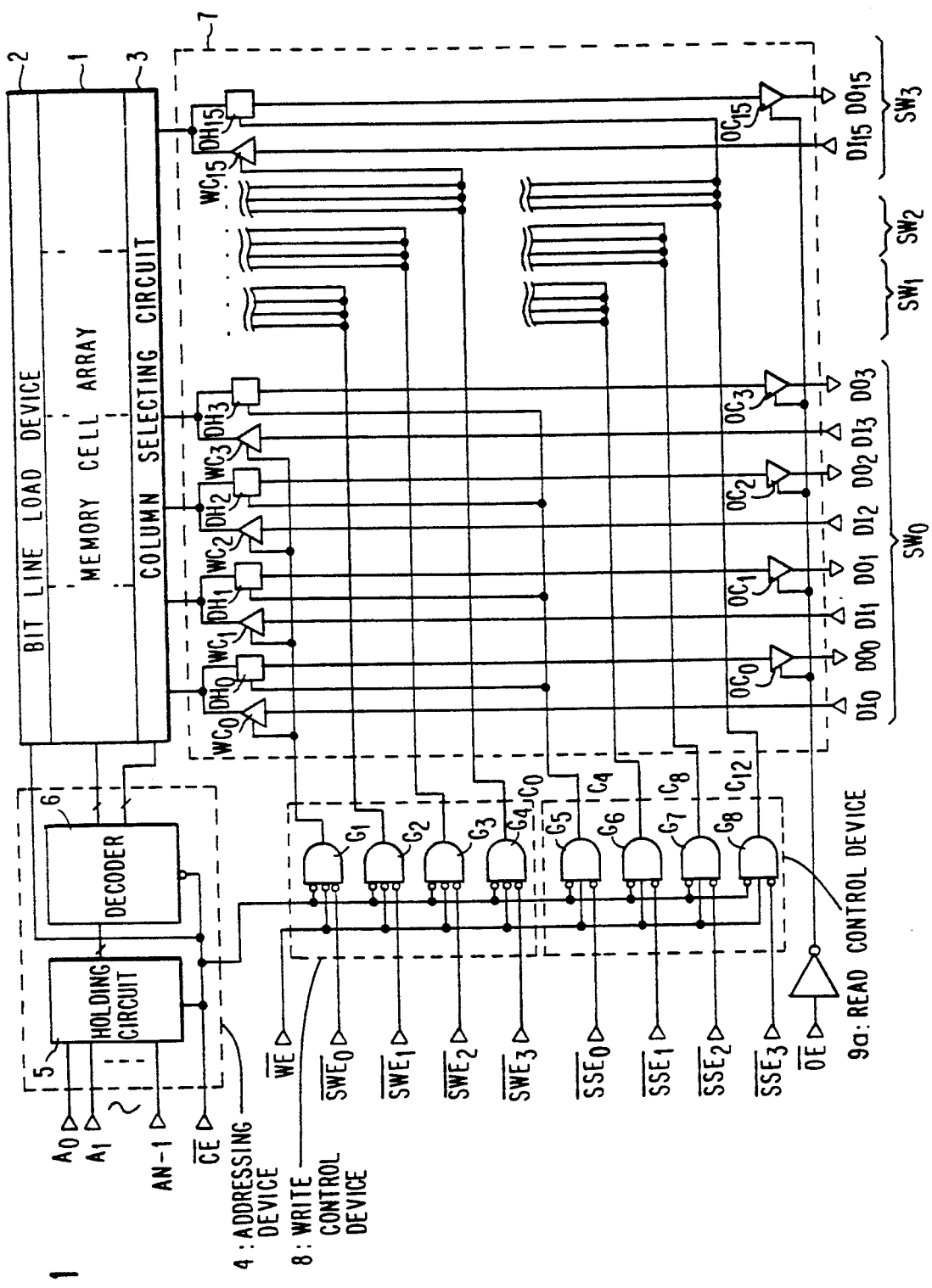
FIG. 1 is a diagram showing the structure of a semiconductor memory device in accordance with one embodiment of the invention.

In FIG. 1, the structures of a data input-output device 7 and a read control device 9a are, as in the following, different from the structures of a data input-output device 70 and a read control device 90 shown in FIG. 8. The semiconductor memory device of FIG. 1 is not provided with an output control device 91 shown in FIG. 8. The structures of other portions are the same as the structures of those shown in FIG. 8.

In this embodiment, the read control device 9a functions as a dividing circuit and a second selecting circuit.

Figure 8:
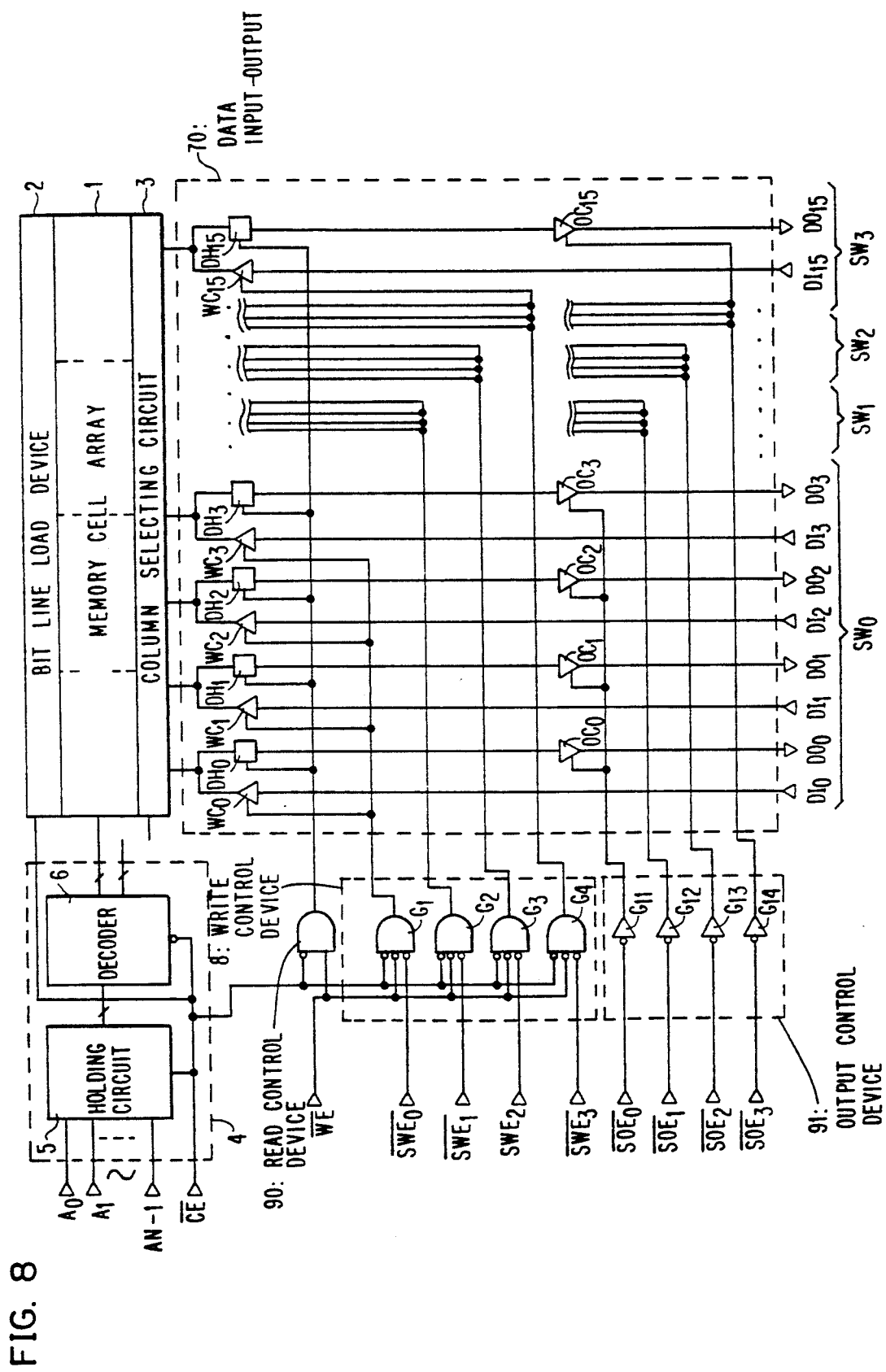
FIG. 8 is a diagram showing one example of a conventional semiconductor memory device
Figure 9:
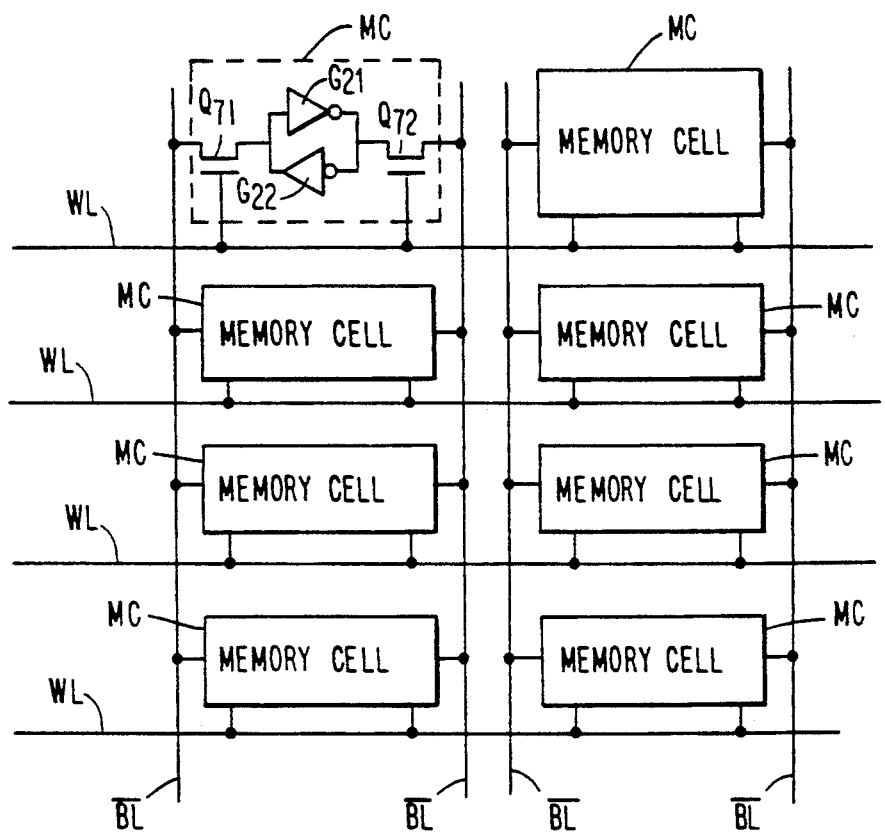
FIG. 9 is a circuit diagram showing the structure of a memory cell array.

The data input-output device 7, as well as the data input-output device 70 shown in FIG. 8, includes 16 write circuits WC0-WC15, 16 data holding circuits DH0-DH15 and 16 output circuits OC0-OC15. The write circuits WC0-WC15, as well as the write circuits WC0-WC15 shown in FIG. 8, are connected to the write control device 8. As will be described later, the connections of the data holding circuits DH0-DH15 and the output circuits OC0-OC15 are different from the connections shown in FIG. 8.

The read control device 9a includes four 3-input AND circuits G5-G8 corresponding to four subwords SW0-SW3. Each of the AND circuits G5-G8 has one input terminal receiving an inverted signal of a chip enable signal $\overline{CE}$, and another one input terminal receiving a write enable signal $\overline{WE}$. The remaining input terminals of the AND circuits G5-G8 receive subword selection signals $\overline{SSE0}$-$\overline{SSE3}$. The subword selection signals $\overline{SSE0}$-$\overline{SSE3}$ respectively correspond to the subword SW0-SW3.

The output of the AND circuit G5 is supplied to the control terminals of four corresponding data holding circuits DH0-DH3 as an output control signal C0. Similarly, the output of the AND circuit G6 is supplied to the control terminals of four corresponding data holding circuits as an output control signal C4. The output of the AND circuit G7 is supplied to the control terminals of four corresponding data holding circuits as an output control signal C8. The output of the AND circuit G8 is supplied to the control terminals of four corresponding data holding circuits as an output control signal C12.

The control terminals of the output circuits OC0-OC15 receive an externally applied output enable signal $\overline{OE}$.

The operation of writing data is the same as the operation of writing data in the semiconductor memory device in FIG. 8. In this case, the write enable signal $\overline{WE}$ attains an L level, so that the output control signals C0, C4, C8, C12 supplied from the read control device 9a all attain an L level. Therefore, the data holding circuits DH0-DH15 are all brought to an inactive state.

The operation of reading data will now be described referring to the waveform diagram of FIG. 2.

In the drawing, suppose that a subword SW0 controlled by the subword selection line $\overline{SSE0}$ is selected, and other subwords SW1-SW3 are not selected.

The chip enable signal $\overline{CE}$ attains an L level, and the write enable signal $\overline{WE}$ attains an H level. The AND circuits G5-G8 in the read control device 9a are thereby brought to an operating state. At this time, the outputs of the NOR circuits G1-G4 in the write control device 8 attain an L level. Therefore, the outputs of the write circuits WC0-WC15 are in a high impedance state.

16 memory cells MC in the memory cell array 1 are selected by address signals A0-AN-1.

The subword selection signal $\overline{SSE0}$ attains an L level, and the remaining subword selection signals $\overline{SSE1}$ to $\overline{SSE3}$ remain at an H level. The output control signal C0 supplied from the AND circuit G5 attains an H level, and the output control signals C4, C8, C12 supplied from the AND circuits G6, G7, G8 attain an L level. As a result, the data holding circuits DH0-DH3 are brought to an active state, and the remaining data holding circuits are put in an inactive state. Therefore, the data held in the data holding circuits DH0-DH3 is rewritten with the data corresponding to the subword SW0 in the data of one word read from the memory cell array 1. The data held in the remaining data holding circuits does not change, and remains in the previous state.

When the output enable signal $\overline{OE}$ attains an L level, the data of one word held in the data holding circuits DH0-DH15 is externally supplied as output data DO0-DO15 through the output circuits OC0-OC15.

When the output enable signal $\overline{OE}$ attains an H level, the output circuits OC0-OC15 are brought to a high impedance state. Therefore, the data of one word held in the data holding circuits DH0-DH15 is not externally supplied as output.

The function of the semiconductor memory device of FIG. 1 will now be described referring to FIGS. 2, 3 and 4.

Figures 2, 3, 4:
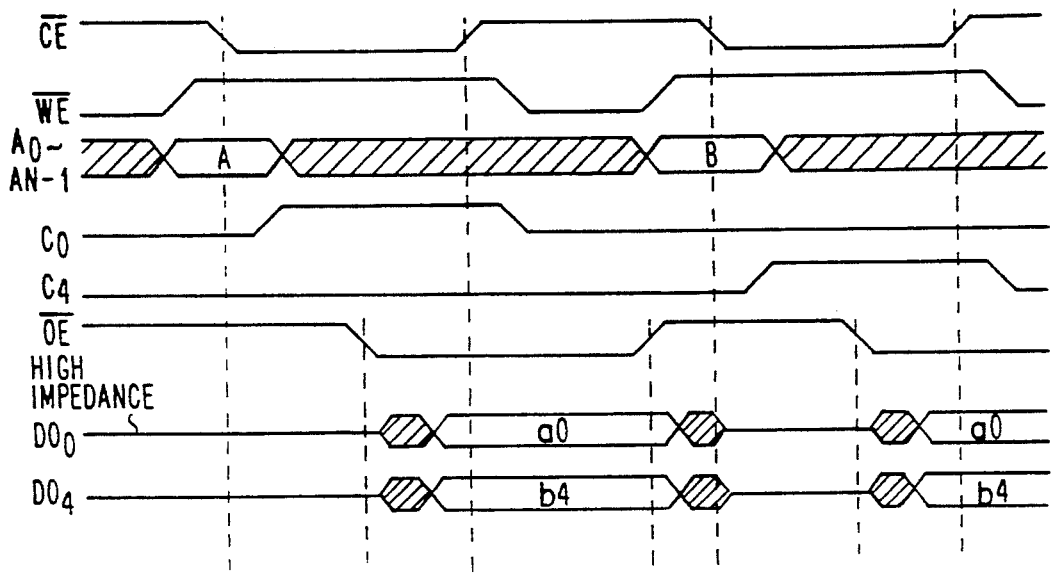
FIG. 2 is a waveform diagram for describing the operation of the semiconductor memory device of FIG. 1.
FIGS. 3 and 4 are diagrams for describing one example of the operation of the semiconductor memory device of FIG. 1.

FIG. 3 shows data stored in the address A and the data stored in the address B in the memory cell array 1. The data a0-a15 are stored in the address A, and the data b0-b15 are stored in the address B. FIG. 4 shows data which are externally supplied as output in a first cycle and a second cycle.

In the first cycle, the address signals A0-AN-1 represent address A, and the subword SW0 is selected by the subword selection signal $\overline{SSE0}$. The output data DO0-DO3 become data a0-a3, and the output data DO4-DO15 remain as data read in the previous cycle. In FIG. 4, x4, x5, x6 represent data read in the previous cycle.

In the second cycle, the address signals A0-AN-1 represent address B, and the subword SW1 is selected by the subword selection signal $\overline{SSE1}$. The output data DO4-DO7 become data b4-b7, and the output data DO0-DO3 and the output data DO8-DO15 retain the state of the first cycle.

In this way, a word including the data a0-a3 of the subword SW0 in the word stoed in the address A and the data b4-b7 of the subword SW1 in the word stored in the address B is held in the data holding circuits DH0–DH15 and supplied as output.

Figure 5:
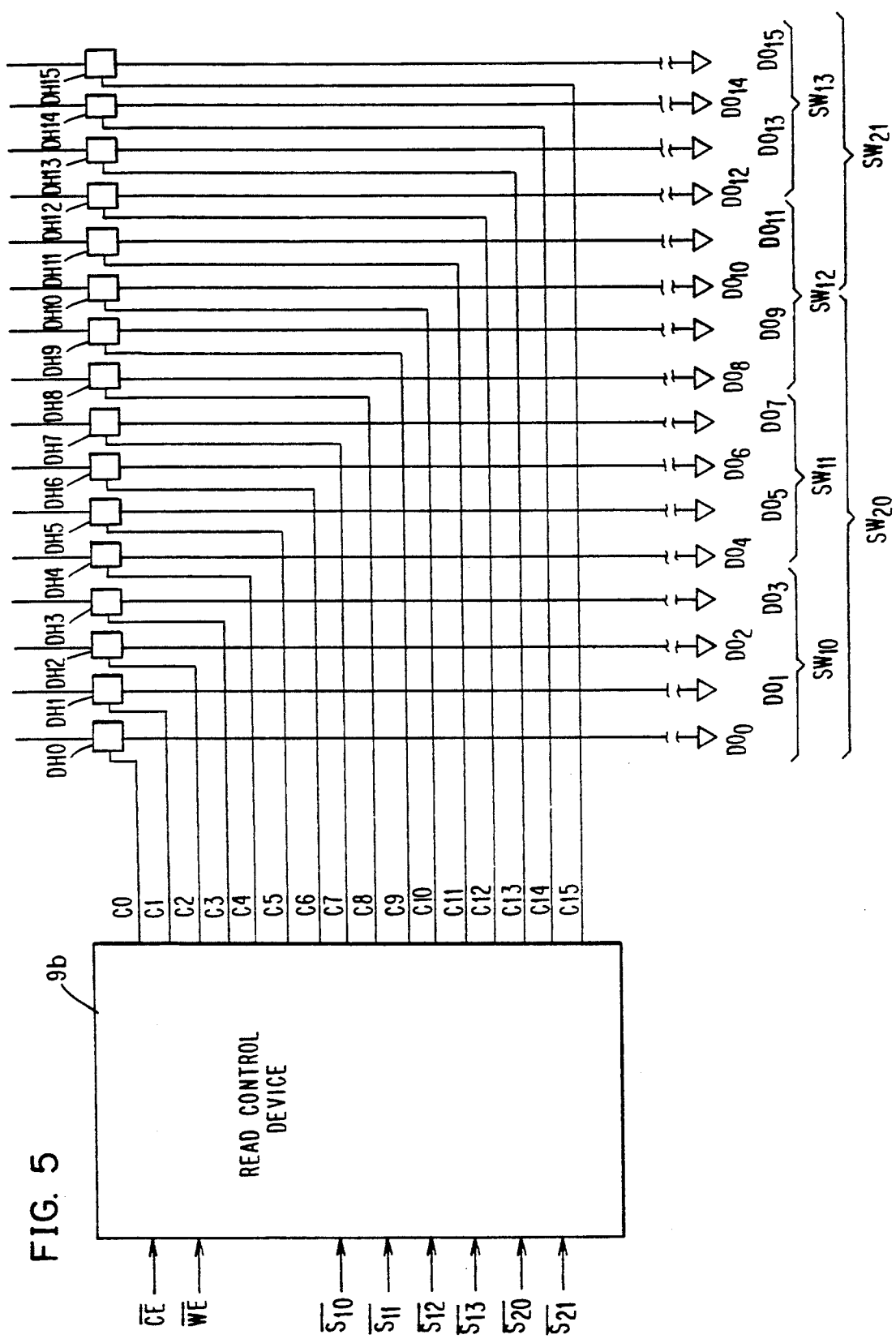
FIG. 5 is a diagram showing the structure of the main portion of a semiconductor memory device in accordance with another embodiment of the invention.

FIG. 5 is a diagram showing the structure of the main portion of a semiconductor memory device in accordance with another embodiment of the invention.

Output circuits DH0–DH15 of the data input-output device and a read control device 9b are only shown in FIG. 5. The structures of other portions are the same as the structures of those in the semiconductor memory device of FIG. 1.

In the semiconductor memory device in accordance with this embodiment, output data DO0–DO15 of one word is divided into subwords by two dividing ways. In a first dividing way, data of one word is divided into four subwords SW10, SW11, SW12, SW13. The subword SW10 includes output data DO0–DO3, and the subword SW11 includes output data DO4–DO7. The subword SW12 includes output data DO8–DO11, and the subword SW13 includes output data D012–D015.

In a second dividing way, data of one word is divided into two subwords SW20, SW21. The subword SW20 includes output data DO0–DO9, and the subword S21 includes output data Do10–DO15.

The read control device 9b receives a chip enable signal $\overline{CE}$, a write enable signal $\overline{WE}$ and subword selection signals $\overline{S10}$-$\overline{S13}$, $\overline{S20}$, $\overline{S21}$. The read control device 9b provides output control signals C0–C15. The output control signals C0–C15 are respectively supplied to the control terminals of data holding circuits DH0–DH15.

The subword selection signals $\overline{S10}$-$\overline{S13}$, $\overline{S20}$, $\overline{S21}$ respectively correspond to the subwords SW10–SW13, SW20, SW21. When any of the subword selection signals $\overline{S10}$-$\overline{S13}$, $\overline{S20}$, $\overline{S21}$ attains an L level, a corresponding subword is selected. For example, when the subword SW10 is selected, the output control signals C0–C3 are brought to an active state. As a result, it becomes possible to rewrite the data held in the data holding circuits DH0–DH3. When the subword SW20 is selected, the output control signals C0–C9 are brought to an active state. As a result, it becomes possible to rewrite the data held in the data holding circuits DH0–DH9.

Figure 6:
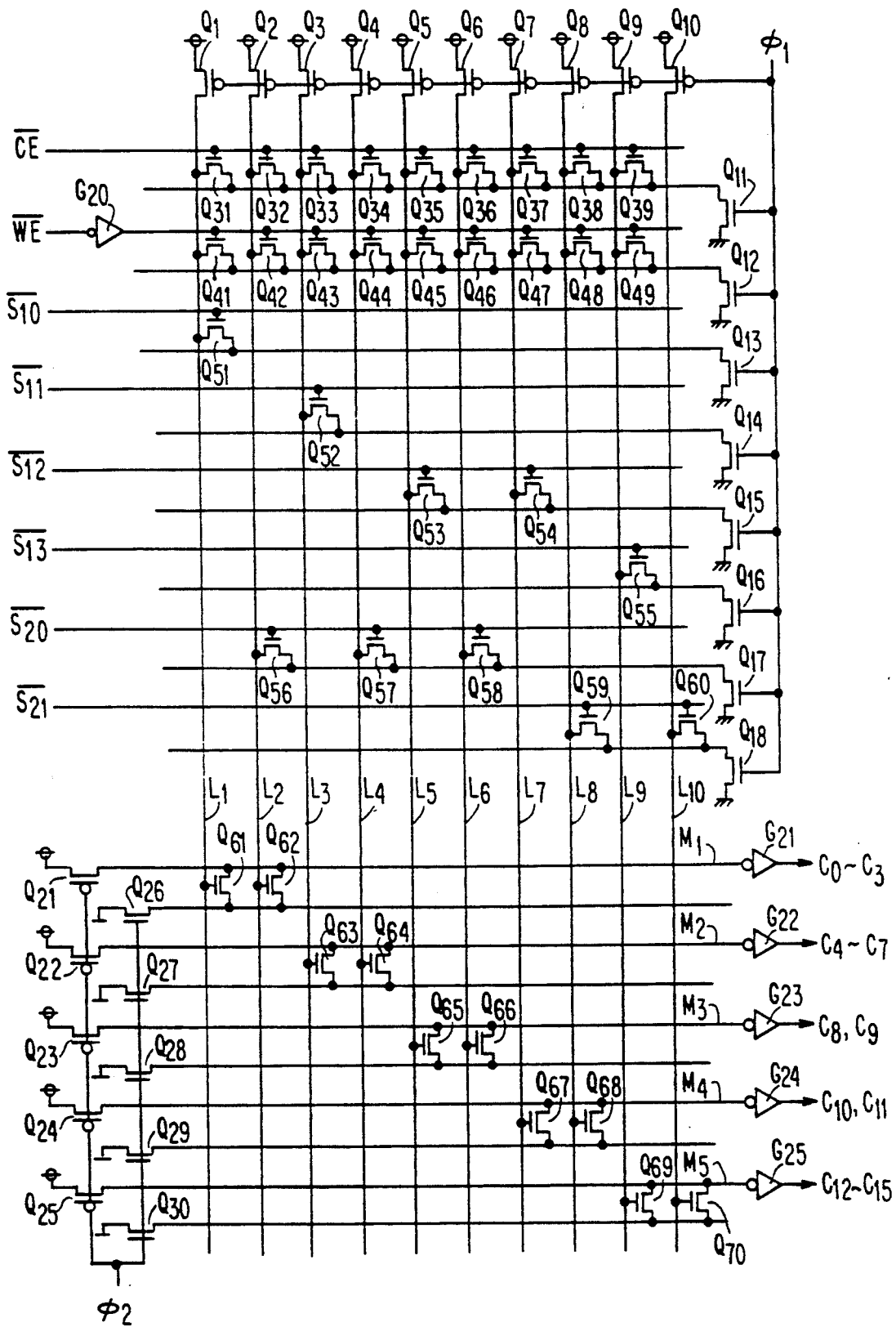
FIG. 6 is a diagram showing a specific circuit structure of a read control device contained in FIG. 5.

FIG. 6 is a diagram showing a specific circuit structure of the read control device 9b shown in FIG. 5.

The read control device of FIG. 6 includes P channel MOS transistors Q1–Q10, Q21–Q25, N channel MOS transistors Q11–Q18, Q26–Q70 and inverters G20–G25. The transistors Q1–Q10 for receiving a signal $\phi1$ function as precharge circuits for precharging the potentials of signal lines L1–L10 to an H level, and the transistors Q21–Q25 for receiving a signal $\phi2$ function as precharge circuits for precharging the potentials of signal lines M1–M5 to an H level. The signals $\phi1$, $\phi2$ may be externally applied or may be generated in the device.

Figure 7:
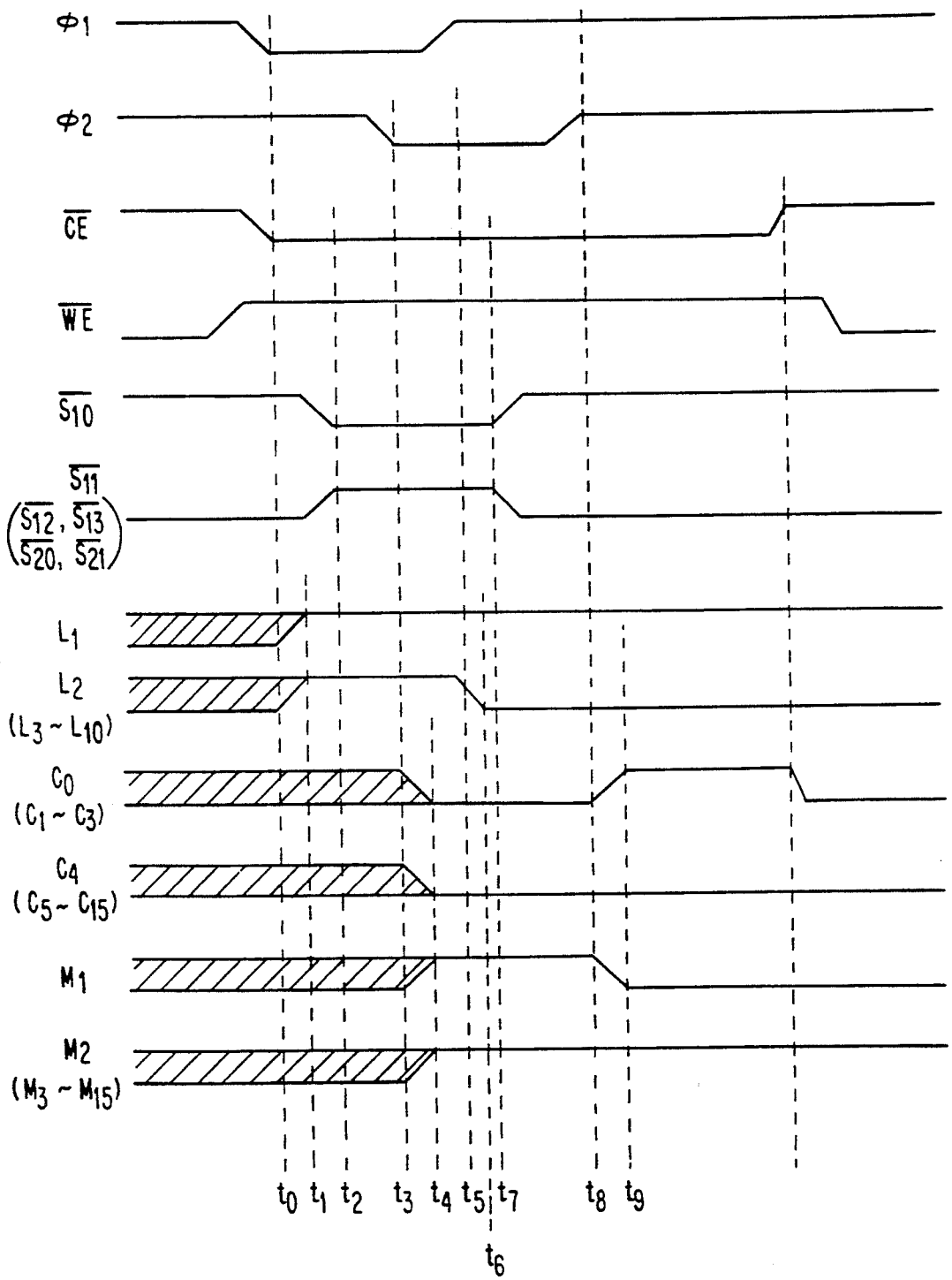
FIG. 7 is a waveform diagram for describing the operation of the read control device of FIG. 6.

The operation of the read control device of FIG. 6 will now be described referring to the waveform diagram of FIG. 7.

A description will be made here of the operation in the case in which only the subword SW10 is selected. A chip enable signal $\overline{CE}$ attains an L level, and a write enable signal $\overline{WE}$ attains an H level. The transistors Q31–Q39 and the transistors Q41–Q49 turn off. At time t0, the signal $\phi1$ attains an L level. The transistors Q1–Q10 turn on, and the transistors Q11–Q18 turn off. As a result, the potentials of the signal lines L1–L10 attain an H level at time t1.

Then, the subword selection signal $\overline{S10}$ attains an L level, and the subword selection signals $\overline{S11}$-$\overline{S13}$, $\overline{S20}$, $\overline{S21}$ attain an H level at time t2. The transistor Q51 turns off, and the transistors Q52–Q60 turn on. At time t5, when the signal $\phi1$ attains an H level, the transistors Q1–Q10 turn off, and the transistors Q11–Q18 turn on. As the potential of the signal line L1 is the result of an NOR operation with respect to the chip enable signal $\overline{CE}$, an inverted signal of the write enable signal $\overline{WE}$ and the subword selection signal $\overline{S10}$, the potential of the signal line L1 attains an H level at time t6. The potentials of the signal lines L2–L10 attain an L level.

The signal $\phi2$ attains an L level at time t3 which is appropriately delayed from time t0. The transistors Q21–Q25 turn on, and the transistors Q26–Q30 turn off. Therefore, the potentials of the signal lines M1–M5 attain an H level at time t4. Then, at time t8, the signal $\phi2$ attains an H level, and the states of the signal lines M1–M5 are determined based on the states of the signal lines L1–L10 determined at time t6.

As the potential of the signal line L1 is at an H level, the transistor Q61 turns on at time t8. The potential of the signal line M1 therefore attains an L level at time t9. As the potentials of the signal lines L2–L10 are at an L level, the potentials of the signal lines M2–M5 are all at an H level.

As a result, the output control signals C0–C3 supplied from the inverter G21 attain an H level, and the output control signals C4–C15 supplied from the inverters G22–G25 attain an L level.

When the subword selection signal $\overline{S20}$, for example, attains an L level, the output control signals C0–C9 supplied from the inverters G21–G23 attain an H level. When the subword selection signal $\overline{S21}$ an L level, the output control signals C10–C15 supplied from the inverters G24, G25 attain an H level.

While the description of the operation above shows the case in which only one of the subwords is selected, a plurality of subwords may be selected simultaneously.

Each circuit included in the data input-output device 7, the write control device 8 and the read control devices 9a, 9b may be brought to an active state by a control signal at an L level, and may be brought to an active state by an control signal at an H level. For example, the control signal may be received through an inverter. Each control signal may have different level for active state.

The way of dividing subwords may be different in input data and output data. Furthermore, a direct control may be effected by a subword selection signal without providing the read control device 9a.

In the embodiment of FIG. 1, while an output enable signal $\overline{OE}$ is supplied to all the output circuits OC0–OC15 corresponding to the data of one word, a plurality of output enable signals may be respectively supplied to the subwords obtained by dividing one word. For example, an output control signal may be supplied to the output circuits OC0–OC15 by the output control device 91 of FIG. 8.

The number of control signals may be changed by appropriately combining any of the chip enable signal $\overline{CE}$, the write enable signal $\overline{WE}$, the sub write enable signals $\overline{SWE0}$-$\overline{SWE3}$ and the subword selection signals $\overline{SSE0}$-$\overline{SSE3}$.

While a semiconductor memory device capable of reading and writing is shown in the embodiment above, the present invention can be effectively applied to a read-only semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   storing means for storing a plurality of data on a word basis;
   first selecting means for selecting and reading data of one word among the plurality of data stored in said storing means;
   holding means for holding data of one word;
   dividing means for dividing the data of one word held in said holding means into a plurality of subwords; and
   second selecting means for selecting any of the plurality of subwords divided by said dividing means, rewriting the selected subword with a corresponding subword among the data of one word read from said storing means and not rewriting the unselected subwords.

2. The semiconductor memory device according to claim 1, wherein said holding means includes a plurality of holding circuit means corresponding to one word, and
   said dividing means and said second selecting means include read control means for dividing said plurality of holding circuit means in accordance with said plurality of subwords, selecting any of said plurality of subwords, and activating a holding circuit means corresponding to the selected subword.

3. The semiconductor memory device according to claim 2, wherein said read control means supplies an activation signal to a holding circuit means corresponding to any of said plurality of subwords in response to a read signal for designating a read operation and an externally applied selection signal.

4. The semiconductor memory device according to claim 3, wherein said read control means receives a plurality of selection signals corresponding to said plurality of subwords and includes a plurality of logic gate means corresponding to said plurality of subwords and each responsive to a corresponding selection signal, said read signal and an externally applied chip enable signal for generating an activation signal.

5. The semiconductor memory device according to claim 2, further including a plurality of output circuit means respectively connected to said plurality of holding circuit means to be activated in response to an externally applied output enable signal.

6. The semiconductor memory device according to claim 2, further comprising:
   a plurality of write circuit means corresponding to one word; and
   write control means for dividing said plurality of write circuit means in accordance with said plurality of subwords, selecting any of said plurality of subwords, and activating the write circuit means corresponding to the selected subword.

7. The semiconductor memory device according to claim 6, wherein said write control means supplies an activation signal to write circuit means corresponding to any of said plurality of subwords in response to a write signal for designating a write operation and an externally applied selection signal.

8. The semiconductor memory device according to claim 7, wherein said write control means receives a plurality of selection signals corresponding to said plurality of subwords and comprises a plurality of logic gate means corresponding to said plurality of subwords and each responsive to a corresponding selection signal, said write signal and an externally applied chip enable signal for generating an activation signal.

9. A semiconductor memory device, comprising:
   storing means for storing a plurality of data on a word basis;
   first selecting means for selecting and reading data of one word among the plurality of data stored in said storing means;
   holding means for holding data of one word;
   dividing means for dividing the data of one word held in said holding means into a plurality of subwords, any one subword having one of either the same number of bits and a different number of bits as any other subword, with the total number of bits of all the subwords being equal to the number of bits of one word; and
   second selecting means for selecting any of the plurality of subwords divided by said dividing means, rewriting the selected subword with a corresponding subword among the data of one word read from said storing means and not rewriting the unselected subwords.

10. The semiconductor memory device according to claim 9, wherein said holding means comprises a plurality of holding circuit means corresponding to one word, and
    said dividing means and said second selecting means comprises read control means for dividing said plurality of holding circuit means in accordance with the plurality of subwords divided by said any way, selecting any of said plurality of subwords, and activating a holding circuit means corresponding to the selected subword.

11. The semiconductor memory device according to claim 10, wherein said read control means supplies an activation signal to a holding circuit means corresponding to any of said plurality of subwords divided by any way in said plurality of ways in response to a read signal for designating a read operation and an externally applied selection signal.

12. The semiconductor memory device according to claim 11, wherein said read control means supplies an activation signal to a holding circuit means corresponding to any of said plurality of subwords in response to a plurality of selection signals corresponding to said plurality of subwords, a read signal for designating a read operation and an externally applied chip enable signal.

13. An operating method of a semiconductor memory device including storing means for storing a plurality of data on a word basis and holding means for holding data of one word, comprising the steps of
    selecting and reading data of one word in the plurality of data stored in said storing means;
    dividing the data of one word held in said holding means into a plurality of subwords; and
    selecting any of said plurality of divided subwords, rewriting the selected subword with a corresponding subword among the data of one word read from said storing means and not rewriting the unselected subwords.

14. An operating method of a semiconductor memory device including storing means for storing a plurality of data on a word basis and holding means for holding data of one word, comprising the steps of selecting and reading data of one word in the plurality of data stored in said storing means;

dividing the data of one word held in said holding means into a plurality of subwords, any one subword having one of either the same number of bits and a different number of bits as any other subword, with the total number of bits of all the subwords being equal to the number of bits of one word; and selecting any of said plurality of divided subwords, rewriting the selected subword with a corresponding subword among the data of one word read from said storing means and not rewriting the unselected subwords.

* * * * *